(12) United States Patent
Sayama et al.

(10) Patent No.: US 11,502,036 B2
(45) Date of Patent: Nov. 15, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventors: Hirokazu Sayama, Tokyo (JP); Fumihiko Hayashi, Tokyo (JP); Junjiro Sakai, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/784,960

(22) Filed: Feb. 7, 2020

(65) Prior Publication Data

US 2021/0249353 A1   Aug. 12, 2021

(51) Int. Cl.
| | | |
|---|---|---|
| *H01L 23/535* | (2006.01) | |
| *H01L 21/74* | (2006.01) | |
| *H01L 21/762* | (2006.01) | |
| *H01L 21/764* | (2006.01) | |
| *H01L 23/522* | (2006.01) | |
| *H01L 21/768* | (2006.01) | |

(52) U.S. Cl.
CPC .......... *H01L 23/535* (2013.01); *H01L 21/743* (2013.01); *H01L 21/764* (2013.01); *H01L 21/76224* (2013.01)

(58) Field of Classification Search
CPC ............. H01L 21/743; H01L 21/76224; H01L 21/764; H01L 23/535
See application file for complete search history.

(56) References Cited

U.S. PATENT DOCUMENTS

| | | | |
|---|---|---|---|
| 10,163,680 B1 | 12/2018 | Hu et al. | |
| 2006/0145286 A1* | 7/2006 | Ohkawa | H01L 21/823814 257/500 |
| 2008/0048294 A1 | 2/2008 | Yamamoto | |
| 2009/0174040 A1* | 7/2009 | Gogoi | H01L 21/764 257/632 |

(Continued)

FOREIGN PATENT DOCUMENTS

JP      2008-053257 A      3/2008

OTHER PUBLICATIONS

Extended European Search Report issued in corresponding European Patent Application No. 21155423.3-1211, dated Jun. 14, 2021.

*Primary Examiner* — Herve-Louis Y Assouman
(74) *Attorney, Agent, or Firm* — McDermott Will & Emery LLP

(57) ABSTRACT

A semiconductor device includes a semiconductor substrate, a semiconductor layer, a first insulating film, and a conductive film. The semiconductor layer is formed on the semiconductor substrate. A first trench reaching the semiconductor substrate is formed within the semiconductor layer. The first insulating film is formed on the inner side surface of the first trench such that a portion of the semiconductor substrate is exposed in the first trench. The conductive film is electrically connected with the semiconductor substrate and formed on the inner side surface of the first trench through the first insulating film. In plan view, a first length of the first trench in an extending direction of the first trench is greater than a second length of the first trench in a width direction perpendicular to the extending direction, and equal to or less than 30 μm.

15 Claims, 13 Drawing Sheets

(56) References Cited

U.S. PATENT DOCUMENTS

| | | | |
|---|---|---|---|
| 2011/0175205 A1* | 7/2011 | Morii | H01L 27/1203 |
| | | | 438/421 |
| 2015/0294898 A1* | 10/2015 | Yamaguchi | H01L 21/02274 |
| | | | 257/506 |
| 2017/0372985 A1* | 12/2017 | Birner | H01L 29/4175 |
| 2018/0033718 A1 | 2/2018 | Kaltalioglu et al. | |
| 2018/0130900 A1* | 5/2018 | Usami | H01L 21/743 |
| 2018/0151410 A1 | 5/2018 | Usami | |
| 2018/0261530 A1* | 9/2018 | Sekikawa | H01L 21/76224 |
| 2020/0365451 A1* | 11/2020 | Tien | H01L 21/76877 |

* cited by examiner

SEMICONDUCTOR DEVICE AND METHOD OF MANUFACTURING THE SAME

BACKGROUND

The present disclosure relates to a semiconductor device and a method of manufacturing the same.

There is disclosed technique listed below.
[Patent Document 1] Japanese Unexamined Patent Application Publication No. 2015-037099

A semiconductor device including a conductive film embedded in a trench formed in an insulating layer or a semiconductor layer is known. For example, a semiconductor device including a contact such as a substrate contact and a via is known (see, e.g., Patent Document 1). The semiconductor device described in Patent Document 1 includes a semiconductor substrate, a semiconductor layer formed on the semiconductor substrate, and an interlayer insulating layer formed on the semiconductor layer. A trench reaching the semiconductor substrate is formed in the interlayer insulating layer and the semiconductor layer. An insulating film is formed on the inner side surface of the trench. The semiconductor device further includes a conductive film formed on the insulating film such that the conductive film buries the trench. The conductive film is formed, for example, by forming a conductive layer on the interlayer insulating layer so as to bury the trench, and then removing a part of the conductive layer located outside the trench by the CMP method.

In the semiconductor device, the conductive film formed in the trench forms a contact. For example, in Patent Document 1, the GND potential of the semiconductor substrate is fixed through the contact.

SUMMARY

However, depending on the material and size of the conductive film, a void (gap) may be formed within the conductive film due to stress caused by the contact when the conductive film is formed. Then, the cleaning liquid used in the CMP step enters the void, and a reaction product of the material of the conductive film and the component of the cleaning liquid is formed on the conductive film. For this reason, in the conventional semiconductor device, a short circuit may occur between two wiring close to each other via the reaction product. As described above, the conventional semiconductor device can be improved from the viewpoint of improving the reliability of the semiconductor device.

It is a problem of the embodiments to improve the reliability of the semiconductor device. Other problems and novel features will become apparent from the description of the specification and drawings.

A semiconductor device according to embodiments includes a semiconductor substrate, a semiconductor layer, a first insulating film, and a conductive film. The semiconductor layer is formed on the semiconductor substrate. A first trench reaching the semiconductor substrate is formed in the semiconductor layer. The first insulating film is formed on an inner side surface of the first trench such that a portion of the semiconductor substrate is exposed in the first trench. The conductive film is electrically connected with the semiconductor substrate and formed on the inner side surface of the first trench through the first insulating film. In plan view, a first length of the first trench in an extending direction of the first trench is greater than a second length of the first trench in a width direction perpendicular to the extending direction, and equal to or less than 30 µm.

A method of manufacturing a semiconductor device according to embodiments includes: forming a first trench penetrating a semiconductor layer so as to reach a semiconductor substrate; forming an insulating film on an inner side surface of the first trench so as to expose a portion of the semiconductor substrate in the first trench; and forming a conductive film on the insulating film formed on the inner side surface of the first trench so as to be electrically connected with the semiconductor substrate. In plan view, a first length of the first trench in an extending direction of the first trench is greater than a second length of the first trench in a width direction perpendicular to the extending direction, and equal to or less than 30 µm.

A semiconductor device according to other embodiments, includes a first wiring, an insulating film formed on the first wiring and having a trench exposing a portion of the first wiring, a conductive film formed in the trench, and a second wiring formed on the insulating layer and electrically connected with the first wiring through the conductive film. In plan view, a first length of the trench in an extending direction of the trench is greater than a second length of the trench in a width direction perpendicular to the extending direction, and equal to or less than 30 µm.

According to the embodiments, the reliability of the semiconductor device can be enhanced.

DETAILED DESCRIPTION

Figure 1:
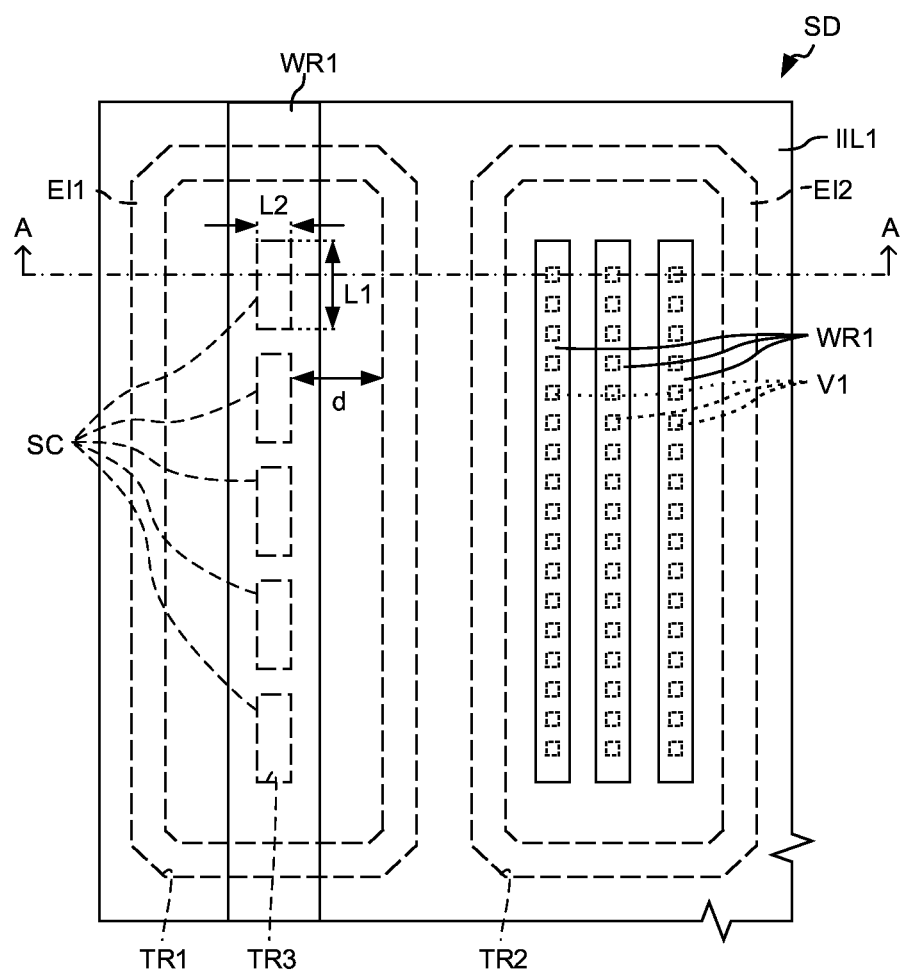
FIG. 1 is a plan view showing an exemplary configuration of a main portion of a semiconductor device according to an embodiment.

Hereinafter, a semiconductor device according to an embodiment and a method of manufacturing the semiconductor device will be described in detail by referring to the drawings. In the specification and drawings, the same or corresponding element is denoted by the same reference numerals or the same hatching, and overlapping description is omitted. In the drawings, for convenience of description, the configuration may be omitted or simplified. A cross-sectional view may be shown as an end view.

[Configuration of Semiconductor Device]

Figure 2:
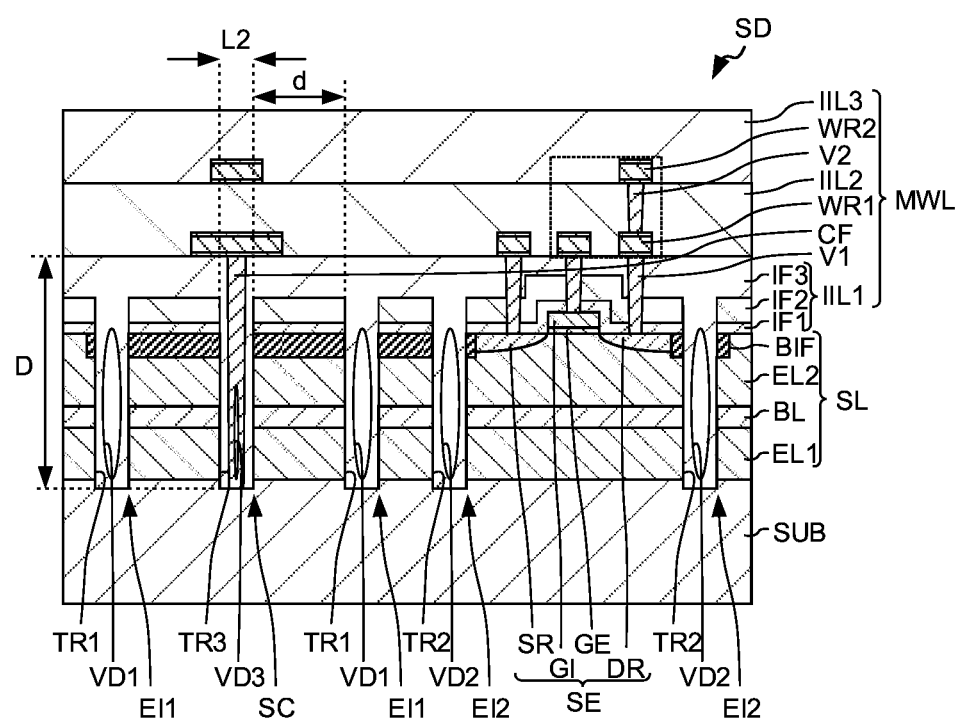
FIG. 2 is a cross-sectional view showing an exemplary configuration of the main portion of the semiconductor device according to an embodiment.

FIG. 1 is a plan view showing an exemplary configuration of a main portion of a semiconductor device SD according to a present embodiment. FIG. 2 is a cross-sectional view showing an exemplary configuration of the main portion of a semiconductor device SD according to a present embodiment. FIG. 2 is the cross-sectional view taken along line A-A in FIG. 1.

The semiconductor device SD includes a semiconductor substrate SUB, a semiconductor layer SL, a semiconductor element SE, and a multilayer wiring layer MWL. As will be described in detail later, the semiconductor device SD includes a first element isolation portion EI1, a second isolation portion EI2, and a substrate contact SC, which are formed of a part of elements of the multilayer wiring layer MWL. In FIG. 1, the elements of the multilayer wiring layer MWL located above a first wiring WR1 are omitted.

The semiconductor substrate SUB supports the semiconductor layer SL. The semiconductor substrate SUB has a first conductivity type. The first conductivity type is P type or N type. Examples of an impurity contained in the P-type semiconductor substrate include boron (B) and indium (In). Examples of the impurity contained in N-type semiconductor substrate include phosphorus (P), arsenic (As), and antimony (Sb).

The semiconductor layer SL is formed on the semiconductor substrate SUB. The semiconductor layer SL includes a first epitaxial layer EL1, a buried layer BL, a second epitaxial layer EL2, and a buried insulating film BIF. The first epitaxial layer EL1, the buried layer BL, and the second epitaxial layer EL2 are formed in this order from the semiconductor substrate SUB side.

The first epitaxial layer EL1 is formed on a surface of the semiconductor substrate SUB. The first epitaxial layer EL1 is a semiconductor layer having the first conductivity type. An impurity concentration of the first epitaxial layer EL1 is, for example, preferably 1×10 13 or more, and 1×10 19 cm-3 or less, and preferably 1×10 13 cm-3 or more, and 1×10 16 cm-3 or less. The first epitaxial layer EL1 is not an essential element. The first epitaxial layer EL1 may be a Silicon On Insulator (SOI) layer of a so-called a SOI substrate.

The buried layer BL is formed on the entire or a portion of the first epitaxial layer EL1. It is preferable that the semiconductor layer SL includes the buried layer BL from the viewpoint of electrically isolating the semiconductor element SE formed on the buried layer BL and the semiconductor substrate SUB from each other in the semiconductor layer SL. The buried layer BL is a semiconductor layer having a second conductivity type opposite to the first conductivity type. An impurity concentration of the buried layers BL is preferably $1\times10^{18}$ cm$^{-3}$ or more, and $1\times10^{21}$ or less, for example.

The second epitaxial layer EL2 is an epitaxial layer formed on the buried layer BL. When the buried layer BL is formed on the entire of the first epitaxial layer EL1, the second epitaxial layer EL2 is formed on the buried layer BL. When the buried layer BL is formed on the portion of the first epitaxial layer EL1, the second epitaxial layer EL2 is formed on the buried layer BL and the first epitaxial layer EL1. An impurity concentration of the second epitaxial layer EL2 is preferably, for example, $1\times10^{13}$ cm$^{-3}$ or more, and $1\times10^{19}$ cm$^{-3}$ or less, and more preferably $1\times10^{13}$ cm$^{-3}$ or more, and $1\times10^{16}$ cm$^{-3}$ or less.

Incidentally, the semiconductor layer SL may further include one or more embedded layers as required. The buried layer may be formed in the first epitaxial layer EL1 or in the second epitaxial layer EL2. The buried layer, in plan view, may be formed with overlapping with an entirety of the buried layer BL, or may be formed with overlapping with a portion of the buried layer BL. The conductivity type of the buried layer may be P type or N type.

The buried insulating film BIF is formed in the second epitaxial layer EL2 of the semiconductor layer SL. The buried insulating film BIF is formed such that the buried insulating film BIF surrounds the semiconductor element SE in plan view. The buried insulating film BIF is an insulating film formed on a main surface of the semiconductor layer SL. The position, number, and size of the buried insulating film BIF are not particularly limited as long as the semiconductor element SE can be electrically insulated from other semiconductor elements (not shown). The buried insulating film BIF is formed of, for example, silicon oxide ($SiO_2$).

A first trench TR1, a second trench TR2 and a third trench TR3 reaching semiconductor substrate are formed on the main surface of the semiconductor layer SL. That is, the first trench TR1, the second trench TR2 and the third trench TR3 are opened in the main surface of the semiconductor layer SL. The first trench TR1 defines the position, size, and shape of the first element isolation part EI1. The second trench TR2 defines the position, size, and shape of the second element isolation part EI2. The third trench TR3 defines the position, size and shape of the substrate contact SC.

The semiconductor element SE is formed on the main surface of the semiconductor layer SL. The semiconductor element SE is not particularly limited, and the semiconductor element SE may be a so-called planar MOSFET or a laterally diffused MOSFET(LDMOSFET). In the present embodiment, the semiconductor element SE is a planar MOSFET. The semiconductor element SE includes a source region SR, a drain region DR, a gate insulating film GI, and gate electrode GE. The main surface of the substrate SUB is a surface on which the semiconductor element SE is formed.

The multilayer wiring layer MWL is formed on the semiconductor layer SL such that the multilayer wiring layer MWL covers the semiconductor element SE. The multilayer wiring layer MWL is constituted by two or more wiring layers. The wiring layer is a layer including an interlayer insulating layer and one or both of a wiring and a via that are formed in the interlayer insulating layer. The via is a conductive member electrically connecting two wirings formed in layers differing from each other.

The multilayer wiring layer MWL includes a first interlayer insulating layer IIL1, a first via V1, a conductive film CF, a first wiring WR1, a second interlayer insulating layer IIL2, a second via V2, a second wiring WR2, and a third interlayer insulating layer IIL3. As will be described in detail later, a first portion of the first interlayer insulating layer IIL1 constitutes the first element isolation part EI1. A second portion of the first interlayer insulating layer IIL1 constitutes the second element isolation part EI2. A third portion of the first interlayer insulating layer IIL1 and the conductive film CF constitute the substrate contact SC.

The first interlayer insulating layer IIL1 is formed on the semiconductor layer SL such that the first interlayer insulating layer IIL1 covers the semiconductor element SE. The first interlayer insulating layer IIL1 may be formed of a single layer or a plurality of layers. In present embodiment, the first interlayer insulating layer IIL1 includes a first insulating film IF1, second insulating film IF2 and a third insulating film IF3.

The first insulating film IF1 is formed on the semiconductor layer SL such that the first insulating film IF1 covers the semiconductor element SE. Examples of materials for the first insulating film IF1 include silicon oxide and silicon nitride. A thickness of the first insulating film IF1 is, for example, 10 nm or more, and 100 nm or less.

The second insulating film IF2 is formed on the first insulating film IF1. Examples of materials for the second insulating film IF2 include silicon oxide and silicon nitride. A thickness of the second insulating film IF2 is, for example, 50 nm or more, and 1 μm or less.

The third insulating film IF3 is formed in the first trench TR1, the second trench TR2 and the third trench TR3, and on the second insulating film IF2.

A first portion of the third insulating film IF3 is formed on the inner side surface and the bottom surface of the first trench TR1. The first portion of the third insulating film IF3 constitutes the first element isolation part EI1. The first element isolation part EI1 insulates the substrate contact SC from the semiconductor element SE, for example. The first portion of the third insulating film IF3 is preferably formed in the first trench TR1 such that a first void VD1 is formed in the first trench TR1. In the present embodiment, the first void VD1 is formed within the first portion of the third insulating film IF3. As a result, the insulating characteristic of the first element isolation part EI1 is enhanced.

As shown in FIG. 1, the first element isolation part EI1 (the first portion) is formed such that the first element isolation part EI1 surrounds the substrate contact SC in plan view. In the first element isolation part EI1, the first void VD1 is formed within the first portion of the third insulating film IF3. From the viewpoint of enhancing the insulating characteristics of the first element isolation part EI1, it is preferable that a first length of the first void VD1 in a depth direction of the first trench TR1 is great (large). In addition, from the viewpoint of enhancing the insulating characteristics of the first element isolation part EI1, it is preferable that a second length of the first void VD1 in a width direction of the first trench TR1 is great. The depth direction of the first trench TR1 is the same as the thickness direction of the semiconductor layer SL.

The second portion of the third insulating film IF3 is formed on the inner side surface and the bottom surface of the second trench TR2. The second portion of the third insulating film IF3 constitutes the second element isolation part EI2. The second element isolation part EI2 insulates the semiconductor element SE from other semiconductor elements (not shown), for example. The second portion of the third insulating film IF3 is preferably formed in the second trench TR2 such that a second void VD2 is formed in the second trench TR2. In present embodiment, the second void VD2 is formed within the second portion of the third insulating film IF3. As a result, the insulating characteristic of the second isolation portion EI2 is further enhanced.

As shown in FIG. 1, the second element isolation part EI2 (the second portion) is formed such that the second element isolation part EI2 surrounds the semiconductor element SE in plan view. In the second element isolation part EI2, the second void VD2 is formed within the second portion of the third insulating film IF3. From the viewpoint of enhancing the insulating characteristics of the second element isolation part EI2, it is preferable that the first length of the second void VD2 in the depth direction of the second trench TR2 is great. From the viewpoint of enhancing the insulating characteristics of the second isolation portion EI2, it is preferable that the second length of the second void VD2 in the width direction of the second trench TR2 is great. The depth direction of the second trench TR2 is the same as the thickness direction of the semiconductor layer SL.

The first length of the second void VD2 may be the same as or different from the first length of the first void VD1. The second length of the second void VD2 may be the same as or different from the second length of the first void VD1.

The third portion of the third insulating film IF3 is formed in the third trench TR3 on the inner side surface of the third trench TR3 such that a portion of the semiconductor substrate SUB is exposed from the third insulating film IF3. The third portion of the third insulating film IF3 suppresses the semiconductor layer SL and the conductive film CF from being short-circuited with each other. As will be described in detail later, the third portion of the third insulating film IF3 constitutes the substrate contact SC together with the conductive film CF.

Examples of materials of the third insulating film IF3 include silicon oxide. A thickness of a portion, of the third insulating film IF3, formed on the second insulating film IF2 is, for example, 0.1 μm or more, and 1 μm or less. A thickness of a portion, of the third insulating film IF3, formed on the inner side surface of the first trench TR1 and on the inner side surface of the second trench TR2 is, for example, 0.1 μm or more, and 1 μm or less. A thickness of a portion, of the third insulating film IF3, formed on the inner side surface of the third trench TR3 is, for example, 0.1 μm or more, and 1 μm or less.

The first via V1 is formed in the first interlayer insulating layer IIL1 such that the first via V1 reaches the semiconductor element SE. More specifically, the first via V1 is formed in the first interlayer insulating layer IIL1 such that the first via V1 reaches the source region SD, the drain region DR, or the gate electrode GE. The first via V1 electrically connects the source region SD, the drain region DR, or the gate electrode GE with the first wiring WR1. The first via V1 includes, for example, a barrier film and a conductive film formed on the barrier film. Examples of materials for the barrier film include titanium (Ti), titanium nitride (TiN), tantalum (Ta), and tantalum nitride (TaN). Examples of materials for the conductive film include tungsten (W) and aluminum (Al). The barrier film is not an indispensable element.

The conductive film CF is formed on the inner side surface of the third trench TR3 with the third insulating film IF3 interposed therebetween. The conductive film CF is electrically connected with the portion of the semiconductor substrate SUB exposed from the third insulating film IF3 in the third trench TR3. As described above, the conductive film CF forms the substrate contact SC together with the third portion of the third insulating film IF3.

In the width direction of the third trench TR3, a ratio of the conductive film CF occupying inside of the third trench TR3 (the thickness of the conductive film CF/the width of the third trench TR3) is, for example, preferably 1/10 or more, and 4/5 or less, and more preferably 1/10 or more, and 2/3 or less.

In plan view, a first length L1 of the third trench TR3 in an extending direction of the third trench TR3 (see FIG. 1) is greater than a second length L2 of the third trench TR3 in a width direction perpendicular to the extending direction, and equal to or less than 30 µm. When the first length L1 of the conductive film CF is more than 30 µm, the reliability of the semiconductor device SD is insufficient. Therefore, it is preferable that the first length L1 of the third trench TR3 is smaller. The first length L1 of the third trench TR3, in plan view, is preferably greater than the second length L2, and equal to or less than 10 µm from the viewpoint of further enhancing the reliability of the semiconductor device SD as will be described later in detail. The first length L1 of the third trench TR3 is, for example, a length of the third trench TR3 in the main surface of the semiconductor layer SL.

The extending direction of the third trench TR3 is a direction perpendicular to the width direction of the third trench TR3 in plan view. In plan view, the first length L1 of the third trench TR3 in the extending direction of the third trench TR3 is greater than the second length L2 of the third trench TR3 in the width direction of the third trench TR3.

A second length L2 of the third trench TR3 in the width direction of the third trench TR3 (refer to FIGS. 1 and 2) is appropriately set in accordance with the burying property of the conductive film CF and the conductivity of the substrate contact SC. For example, the second length L2 of the third trench TR3 is 0.1 µm or more, and 2 µm or less. The second length L2 of the third trench TR3 is, for example, a length of the third trench TR3 in the main surface of the semiconductor layer SL.

A depth D of the third trench TR3 is appropriately set in accordance with the thickness of the semiconductor layer SL. The depth of the third trench TR3 is preferably, for example, 1 µm or more, and 100 µm or less, and more preferably 6 µm or more, and 30 µm or less.

The number of the conductive film CF (the substrate contact SC) is not particularly limited. In present embodiment, in plan view, the number of conductive film CF surrounded by one first element isolation part EI1 is five. In present embodiment, the extending direction of the third trench TR3 is the arrangement direction of the five conductive films CF. The conductive film CF may not be surrounded by the first element isolation part EI1 in plan view.

In the width direction of the third trench TR3, it is preferable that the distance d (see FIGS. 1 and 2) between the third trench TR3 (the substrate contact SC) and the first trench TR1 (the first element isolation part EI1) is small from the viewpoint of downsizing the semiconductor device SD. From this viewpoint, the distance d is preferably 5 µm or less, more preferably 2 µm or less, and still more preferably 1 µm or less. Here, the distance d is, for example, a distance between the third trench TR3 and the first trench TR1 in the main surface of the semiconductor layer SL.

On the other hand, from the viewpoint of suppressing the occurrence of cracks in the first multilayer wiring layer IIL1 due to deformation of the first element isolation part EI1 due to stress caused by the substrate contact SC, the distance d is preferably great. From this viewpoint, the distance d is preferably 1 µm or more, more preferably 2 µm or more, and still more preferably 5 µm or more.

From the viewpoint of satisfying both the insulating characteristics of the first element isolation part EI1 and the crack resistance to the first multilayer wiring layer IIL1, the distance d is preferably 1 µm or more and 2 µm or less.

The shape and the position of the third trench TR3 in plan view are not particularly limited. The shape of the third trench TR3 in plan view may be, for example, a substantially rectangular shape, an elliptical shape, or a rounded rectangular shape. In the present embodiment, the third trench TR3 extends along the first trench TR1 in plan view, and is surrounded by the first trench TR1.

In present embodiment, the conductive film CF is formed in the third trench TR3 such that a third void VD3 is formed within the third trench TR3. The third void VD3 is formed within the third portion of the third insulating film IF3. From the viewpoint of enhancing the conductivity of the substrate contact SC, it is preferable that the first length of the third void VD3 in the depth direction of the third trench TR3 is small. From the viewpoint of enhancing the conductivity of the substrate contact SC, it is preferable that the second length of the third void VD3 in the width direction of the third trench TR3 is small. The depth direction of the third trench TR3 is the same as the thickness direction of the semiconductor layer SL.

rom the viewpoint of compatibility between the conductivity of the substrate contact SC and the insulating characteristics of the first element isolation part EI1 and the second element isolation part EI2, it is preferable that the size of the third void VD3 in the substrate contact SC is smaller than the size of the first void VD1 in the first element isolation part EI1 and the size of the second void VD2 in the second element isolation part EI2. More specifically, in the depth direction of the third trench TR3, the first length of the third void VD3 is smaller than the first length of the first void VD1 and the first length of the second void VD2. It is preferable that the second length of the third void VD3 is smaller than the second length of the first void VD1 and the second length of the second void VD2 in the width direction of the second trench TR3.

The material of the conductive film CF is, for example, a metallic having conductivity. Examples of materials for the conductive film CF include tungsten (W), titanium (Ti), titanium nitride (TiN), tantalum (Ta), tantalum nitride (TaN), aluminum (Al), copper (Cu), and nickel (Ni).

The first wiring WR1 is formed on the first interlayer insulating layer IIL1. The first wiring WR1 is electrically connected with the semiconductor substrate SUB via the conductive film CF. For the first wiring WR1, a well-known structure employed as a wiring in the semiconductor technology can be employed. The first wiring WR1 is, for example, a stacked film in which a barrier metal, a conductive film, and a barrier metal are stacked in this order. Examples of materials constituting the barrier metal include titanium (Ti), titanium nitride (TiN), tantalum (Ta), and tantalum nitride (TaN). Examples of materials of the conductive film include aluminum, copper, and tungsten.

The second interlayer insulating layer IIL2 is formed on the first interlayer insulating layer IIL1 such that the second interlayer insulating layer IIL2 covers the first wiring WR1. Examples of materials for the second interlayer insulating layer IIL2 are silicon oxides.

The second via V2 is formed within the second interlayer insulating layer IIL2 such that the first wiring WR1 and second wiring WR2 are electrically connected with each other. Examples of materials of the second via V2 are the same as those of the first via V1.

The second wiring WR2 is formed on the second interlayer insulating layer IIL2. Examples of materials of the second wiring WR2 are similar to those of the first wiring WR1.

The third interlayer insulating layer IIL3 is formed on the second interlayer insulating layer IIL2 such that the third interlayer insulating layer IIL3 covers the second wiring WR2. Examples of materials for the third interlayer insulating layer IIL3 are silicon oxides.

[Method of Manufacturing Semiconductor Device]

FIGS. 3 to 10 are cross-sectional views showing exemplary steps included in the method of manufacturing the semiconductor device SD according to the present embodiment.

The method of manufacturing the semiconductor device SD according to the present embodiment includes (1) providing the semiconductor wafer SW, (2) forming the semiconductor element SE, (3) forming the first insulating film IF1 and the second insulating film IF2, (4) forming the first trench TR1, the second trench TR2 and the third trench TR3, (5) forming the third insulating film IF3, (6) forming a trench TRcf for the conductive film and a through hole CTv1 for the first via, (7) forming the conductive film CF and the first via V1, and (8) forming the remaining part of the multilayer wiring layer MWL.

(1) Providing of Semiconductor Wafer SW

Figure 3:
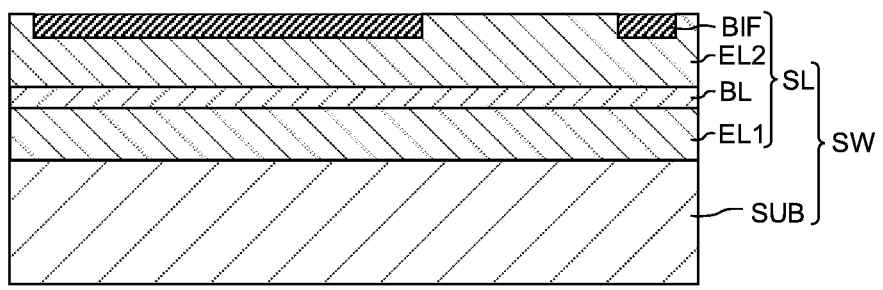
FIG. 3 is a cross-sectional view showing an exemplary step included in a method of manufacturing the semiconductor device according to the embodiment.

As shown in FIG. 3, a semiconductor wafer SW is provided. The semiconductor wafer SW includes a semiconductor substrate SUB and semiconductor layer SL formed on the semiconductor substrate SUB. The semiconductor wafer SW may be purchased or manufactured as an off-the-shelf product. The semiconductor substrate SUB is held on an electrostatic chuck.

The semiconductor substrate SUB is, for example, a semiconductor substrate of the first conductivity type or the second conductivity type.

The semiconductor layer SL includes the first epitaxial layer EL1, the buried layer BL, the second epitaxial layer EL2, and the buried insulating film BIF. The semiconductor layer SL may be formed by a method known in the semiconductor art as a method of forming a semiconductor layer.

The first epitaxial layer EL1 is formed on the semiconductor substrate SUB by an epitaxial growth method. The buried layer BL is formed on the first epitaxial layer EL1 by ion implantation and activate annealing. The second epitaxial layer EL2 is formed on the buried layer BL by an epitaxial growth method.

The buried insulating film BIF may be formed by forming a recess portion on the main surface of the second epitaxial layer EL2 by an etching method, and then burying the recess portion with an insulating film. The buried insulating film BIF may be formed by oxidizing a portion of the main surface of the second epitaxial layer EL2 by a LOCOS method.

(2) Forming Semiconductor Element SE

Figure 4:
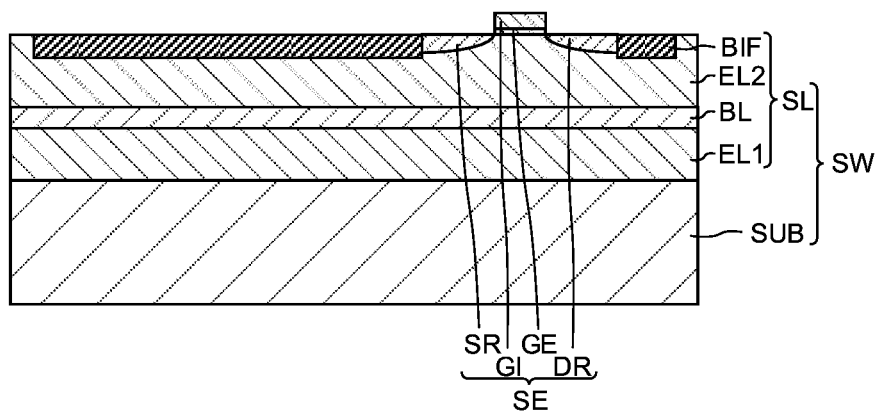
FIG. 4 is a cross-sectional view showing an exemplary step included in the method of manufacturing the semiconductor device according to the embodiment.

Subsequently, as shown in FIG. 4, the semiconductor element SE is formed on the main surface of the semiconductor layer SL. A method of forming the semiconductor element SE is not particularly limited, and a known method can be employed as a method of forming a semiconductor element. In the present embodiment, the semiconductor element SE includes the source region SR, the drain region DR, the gate insulating film GI, and the gate electrode GE.

The source region SR and the drain region DR are formed by, for example, ion implantation and activate annealing. In plan view, the gate insulating film GI is formed on a portion of the main surface of the semiconductor layer SL located between the source region SR and the drain region DR. The gate electrode GE is formed on the gate insulating film GI.

(3) Forming First Insulating Film IF1 and Second Insulating Film IF2

Figure 5:
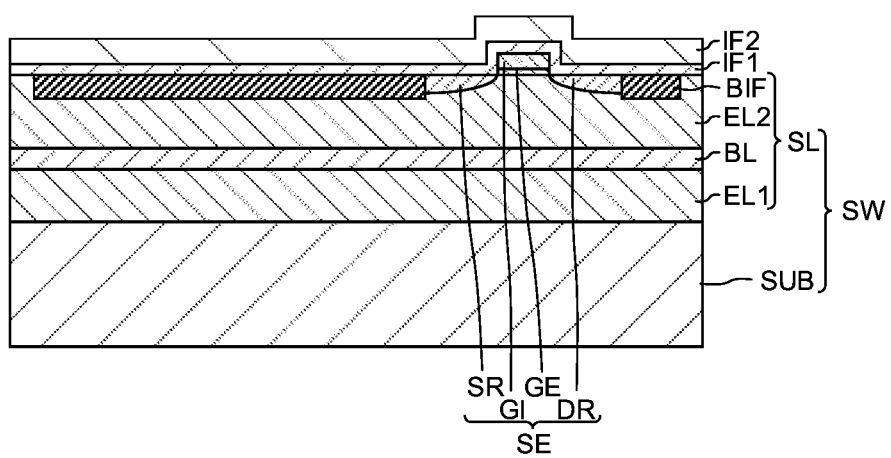
FIG. 5 is a cross-sectional view showing an exemplary step included in the method of manufacturing the semiconductor device according to the embodiment.

Subsequently, as shown in FIG. 5, the first insulating film IF1 and the second insulating film IF2 are formed on the semiconductor layers SL so as to cover the semiconductor element SE. A method of forming the first insulating film IF1 and the second insulating film IF2 is, for example, a CVD method.

(4) Forming First Trench TR1, Second Trench TR2 and Third Trench TR3

Figure 6:
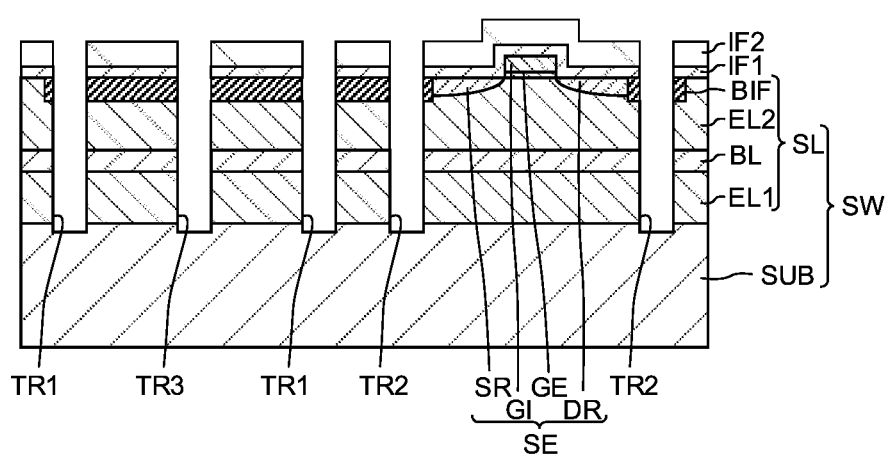
FIG. 6 is a cross-sectional view showing an exemplary step included in the method of manufacturing the semiconductor device according to the embodiment.

Subsequently, as shown in FIG. 6, the first trench TR1, the second trench TR2 and the third trench TR3 which extend along the thickness direction of the semiconductor layer SL so as to reach the semiconductor substrate SUB, and penetrate the second insulating film IF2, the first insulating film IF1, and the semiconductor layer SL are formed. In the present embodiment, the first trench TR1, second trench TR2 and the third trench TR3 penetrate the buried insulating film BIF, the second epitaxial layer EL2, the buried layer BL, and the first epitaxial layer EL1 in the semiconductor layer SL. A method of forming the first trench TR1, the second trench TR2 and the third trench TR3 is, for example, a dry etching method.

(5) Forming Third Insulating Film IF3

Figure 7:
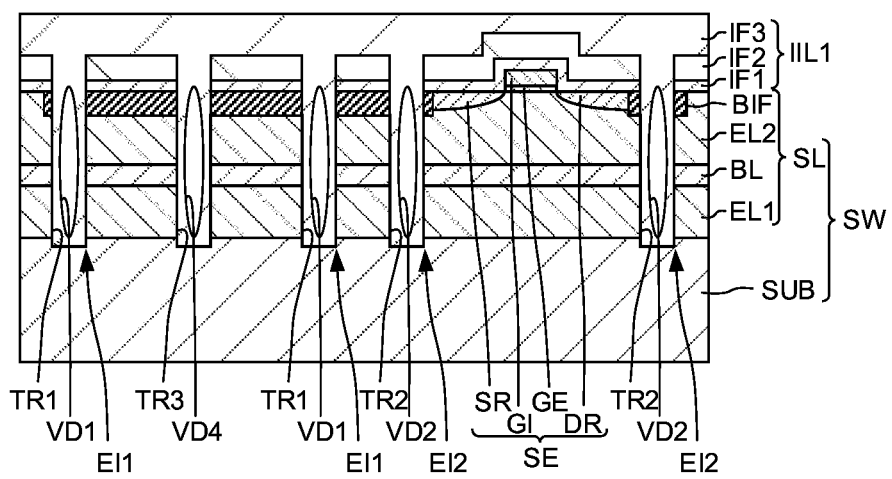
FIG. 7 is a cross-sectional view showing an exemplary step included in the method of manufacturing the semiconductor device according to the embodiment.

Subsequently, as shown in FIG. 7, the third insulating film IF3 is formed in the first trench TR1, the second trench TR2 and the third trench TR3, and on the second insulating film IF2. As a result, the first interlayer insulating layer IIL1 is formed.

The first void VD1 is formed in the first trench TR1. As a result, the first element isolation part EI1 is formed. The second void VD2 is formed in the second trench TR2. As a result, the second element isolation part EI2 is formed. A fourth void VD4 is formed in the third trench TR3. The sizes of the first void VD1, the second void VD, and the fourth void VD4 are appropriately adjusted in accordance with an aspect ratio of the first trench TR1, the second trench TR2 and the third trench TR3 (the ratio of a depth of the trench to a width of the trench), and the materials of the third insulating film IF3. A method of forming the third insulating film IF3 is, for example, a CVD method.

(6) Forming Trench TRcf for Conductive Film and Through Hole CTv1 for First Via

Figure 8:
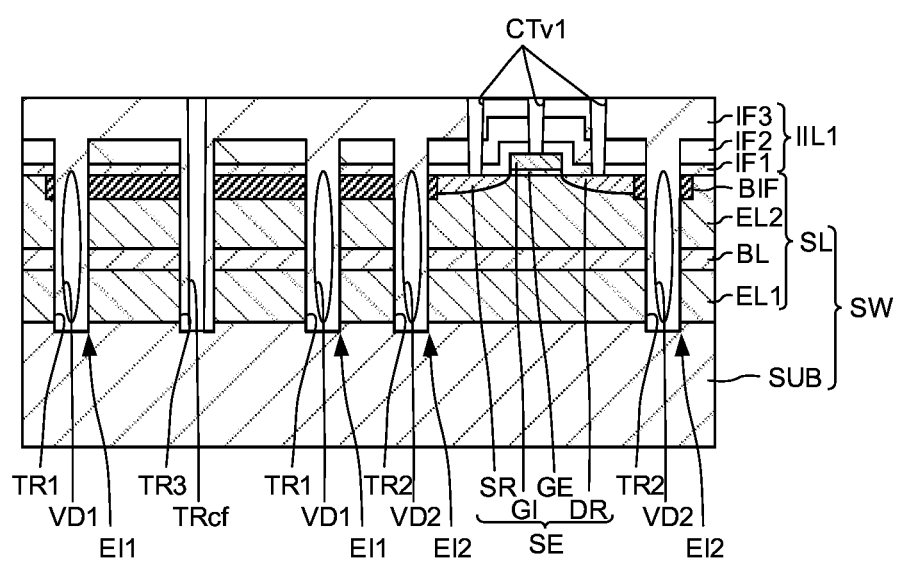
FIG. 8 is a cross-sectional view showing an exemplary step included in the method of manufacturing the semiconductor device according to the embodiment.

Subsequently, as shown in FIG. 8, a trench TRcf for the conductive film and a through hole CTv1 for the first via are formed. The trench TRcf for the conductive film is a through hole formed in the third insulating film IF3 so as to communicate with the fourth void VD4 and expose a portion of the semiconductor substrate SUB. The through hole CTv1 for the first via is a through hole penetrating the first interlayer insulating layer IIL1 so as to reach the source region SR, the drain region DR, and the gate electrode GE, respectively. A method of forming the trench TRcf for the conductive film and the through hole CTv1 for the first via is, for example, a dry-etching method.

(7) Formation of Conductive Film CF and First Via V1

Figure 9:
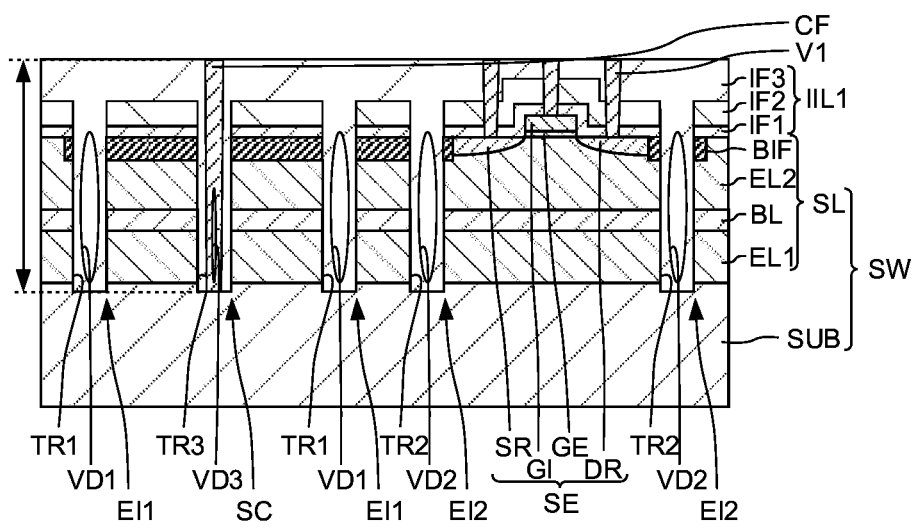
FIG. 9 is a cross-sectional view showing an exemplary step included in the method of manufacturing the semiconductor device according to the embodiment.

Subsequently, as shown in FIG. 9, the conductive film CF and the first via V1 are formed. Specifically, a conductive layer is formed in the trench TRcf for the conductive film and the through hole CTv1 for the first via, and on the third insulating film IF3, and the conductive layer formed outside the trench TRcf for the conductive film and the through hole CTv1 for the first via is removed. The conductive film CF is formed on the third insulating film IF3 formed on the inner side surface of the third trench TR3 so as to be electrically connected with the semiconductor substrate SUB. A method of forming the conductive layer is, for example, a CVD method. A method of removing the conductive layer is, for example, a CMP method. The conductive layer is removed (polished) in a state in which a slurry for CMP is provided on the conductive layer. After treatment by the CMP method, a cleaning liquid is provided on the surface to be polished.

(8) Forming Remaining Part of Multilayer Wiring Layer MWL

Figure 10:
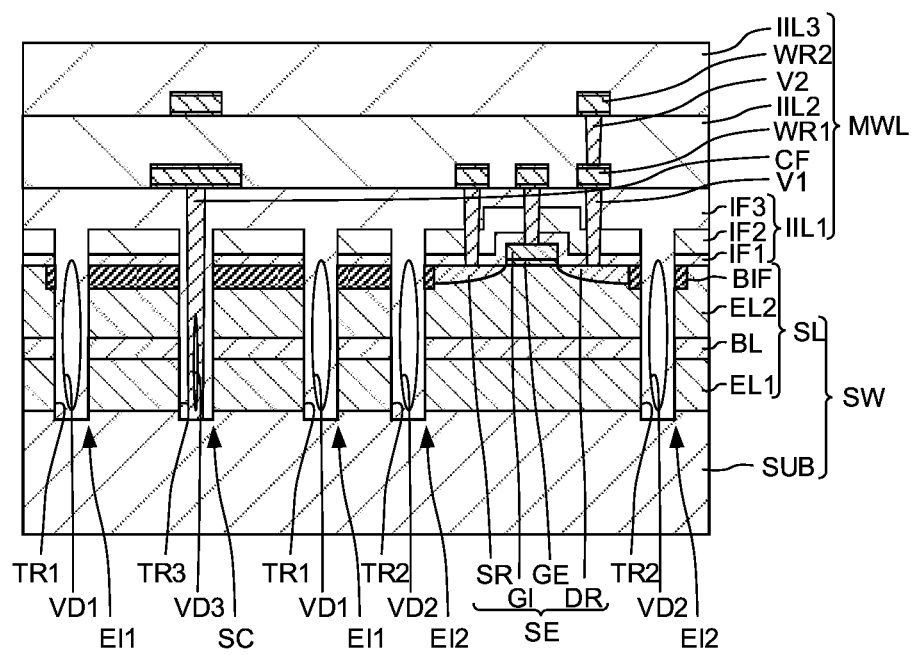
FIG. 10 is a cross-sectional view showing an exemplary step included in the method of manufacturing the semiconductor device according to the embodiment.

Subsequently, as shown in FIG. 10, the first wiring WR1, the second interlayer insulating layer IIL2, the second via V2, the second wiring WR2, and the third interlayer insulating layer IIL3 are formed.

The second interlayer insulating layer IIL2 and the third interlayer insulating layer IIL3 are formed by, for example, a CVD method. The first wiring WR1 is formed by forming a conductive layer on the first interlayer insulating layer IIL1 by a sputtering method, and then patterning the conductive layer into a desired pattern. The second wiring WR2 is formed by forming a conductive layer on the second interlayer insulating layer IIL2 by a sputtering method, and then patterning the conductive layer into a desired pattern. The second via V2 is formed by forming a through hole in the second interlayer insulating layer II L2 and then burying the through hole with a conductive material.

Subsequently, the structures obtained by the above steps are detached from the electrostatic chuck and diced to obtain a plurality of singulated semiconductor devices SD.

The semiconductor device SD according to the present embodiment is manufactured by the above method of manufacturing. The method of manufacturing the semiconductor device SD according to the present embodiment may further include other steps as required. The other steps may be suitably employed from known method in the semiconductor art.

[Simulation]

A simulation was performed to investigate the relation between stress caused by the substrate contact SC and the size of the substrate contact SC. This simulation was performed using a viscoelastic model, taking into account the process temperature in the step of forming each element. The conditions of the present simulation are as follows.

The material of the semiconductor layer SL is silicon. The material of the first insulating film IF1 is silicon nitride (SiN). The materials of the second insulating film IF2 and the third insulating film IF3 are silicon oxide ($SiO_2$). The material of the conductive film CF is tungsten (W).

The wide of the third trench TR3 is 0.90 µm. The length of the conductive film CF in the width direction of the third trench TR3 is 0.60 µm. The thickness of the third insulating film IF3 formed on the inner side surface of the third trench TR3 in the width direction of the third trench TR3 is 0.15 µm.

The simulation was performed for third trench TR3 depths of 4 µm, 8 µm, 12 µm, and 16 µm, respectively.

Figure 11:
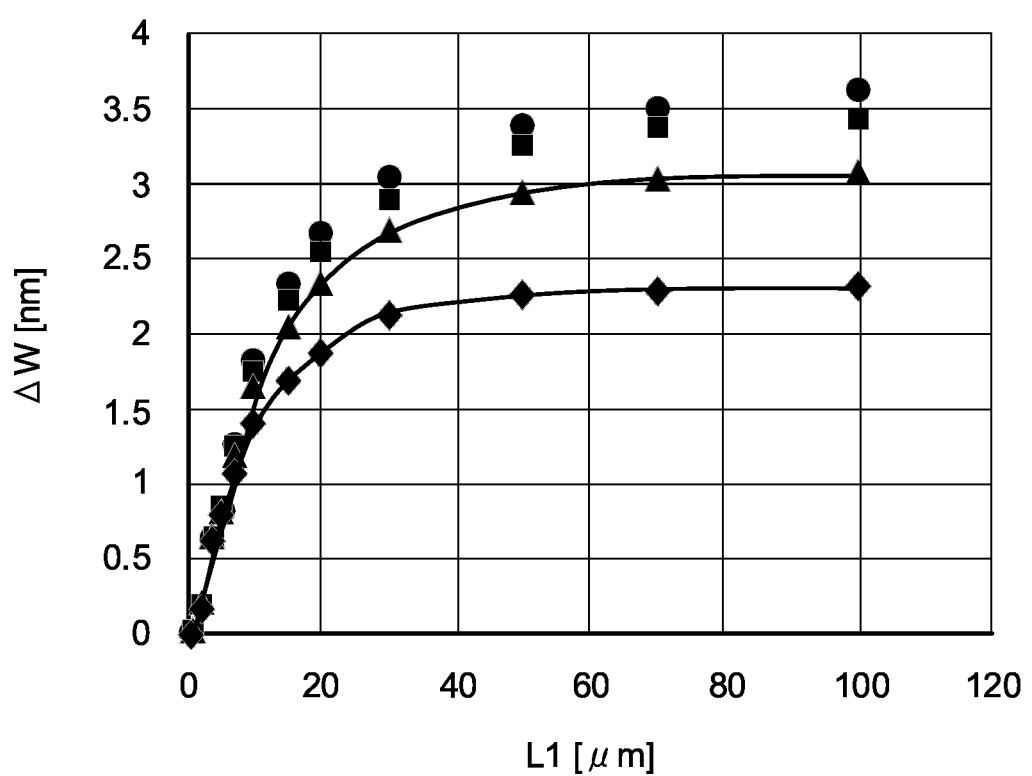
FIG. 11 is a graph showing relation between stress caused by the substrate contact and size of the substrate contact.

FIG. 11 is a graph showing the relation between stress caused by the substrate contact SC and the size of the substrate contact SC. The horizontal axis represents the length L1 [µm] of the third trench TR3 in the extending direction of the third trench TR3. The vertical axis represents the width ΔW of the third void VD3 at the upper end of the conductive film CF. The width of the third void VD3 is the length of the third void VD3 in the width direction of the third trench TR3. As the width of the third void VD3 is greater, it means that stress caused by the substrate contacts SC is greater.

In FIG. 11, black circle indicates the simulated result when the depth of the third trench TR3 is 16 µm. A black square indicates the simulated result when the depth of the third trench TR3 is 12 µm. A black triangle indicates the simulated result when the depth of the third trench TR3 is 8 µm. A black diamond indicates the simulated result when the depth of the third trench TR3 is 4 µm.

As shown in FIG. 11, regardless of the depth of the third trench TR3, as the length L1 of the third trench TR3 decreases, the width ΔW of the third void VD3 decreases. In particular, it can be seen that the width ΔW of the third void VD3 decreases rapidly when the length L1 of the third trench TR3 is 30 µm or less. When the length L1 of the third trench TR3 is 10 µm or less, the width ΔW of the third void VD3 becomes negligibly small. Thus, when the length L1 of the third trench TR3 is 10 µm or less, the third void VD3 of the conductive film CF is substantially closed, that is, negligibly small.

From the result of the simulation, it can be seen that when the length L1 of the third trench TR3 is 30 µm or less, the cleaning liquid used in the CMP step less likely to enter the third void VD3 of the conductive film CF. As this result, the reliability of the semiconductor device SD is improved. When the length L1 of the third trench TR3 is 10 µm or less, the cleaning liquid used in the CMP step is less likely to penetrate into the third void VD3 of the conductive film CF. As this result, the reliability of the semiconductor device SD is further improved.

[Reference Experiment]

Subsequently, a reference experiment was performed to investigate the relation between stress caused by the substrate contact SC and distance from the substrate contact SC. Here, the distance from the substrate contact SC is the distance from an open end of the third trench TR3 in the width direction of the third trench TR3.

In the reference experiment, the current characteristic of a MOSFET formed at a predetermined distance from the substrate contact SC was evaluated. Subsequently, based on the result obtained by the above simulation (the relation between the stress caused by the substrate contact SC and the size of the substrate contact SC), the effect to the current characteristic is estimated for the cases where the length L1 of the third trench TR3 is 5 µm and 50 µm, respectively.

Figure 12:
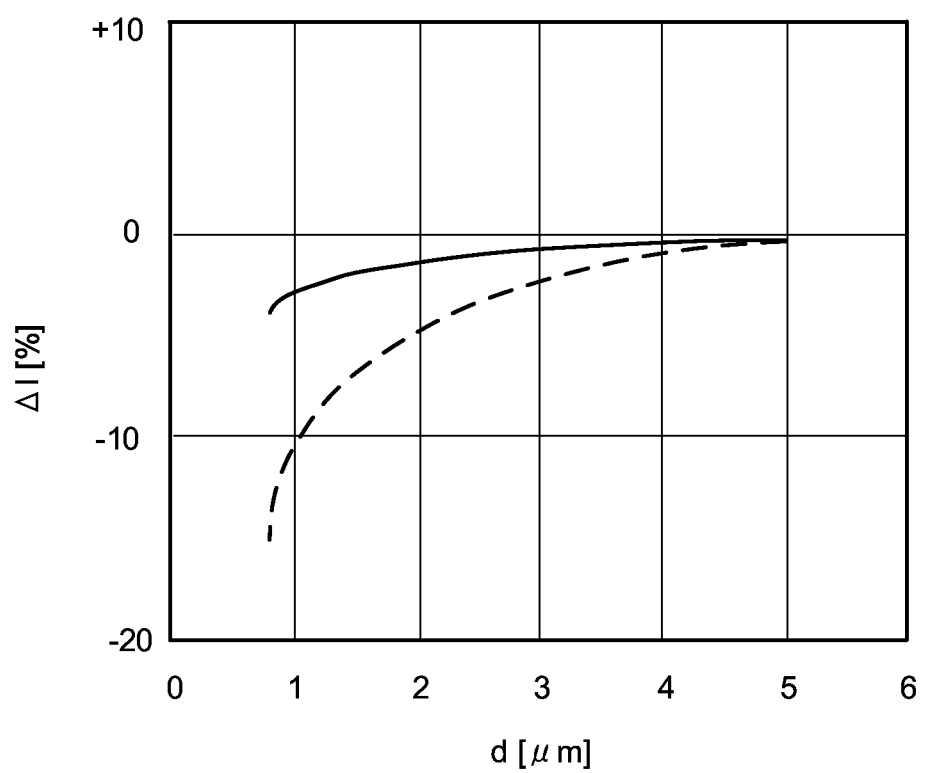
FIG. 12 is a graph showing representation of stress caused by the substrate contact and distance from the substrate contact.

FIG. 12 is a graph showing the relation between stress caused by the substrate contact SC and distance from the substrate contact SC. The horizontal axis represents the distance d [µm] from the third trench TR3 in the width direction of the third trench TR3. The vertical axis represents the rate of change ΔI [%] of the current characteristic of the MOSFET. As the rate of change of the current characteristic of the MOSFET is greater, the stress caused by the substrate contact SCs is greater.

In FIG. 12, the solid line indicates the simulated result when the length L1 of the third trench TR3 is 5 µm. The broken line indicates the simulated result when the length L1 of the third trench TR3 is 50 µm.

As is clear from comparing the solid line and the broken line shown in FIG. 12, as the length L1 of the third trench TR3 is smaller, the rate of change ΔI of the current characteristics of the MOSFET is smaller. For example, if the length L1 of the third trench TR3 is 50 µm, the rate of change ΔI decreases by about 10% when the distance d from the substrate contact SC decreases from 5 µm to 1 µm. On the other hand, when the length L1 of the third trench TR3 is 5 µm, the rate of change ΔI decreases by only about 3% even if the distance d from the substrate contact SC decreases from 5 µm to 1 µm.

From the result of the reference experiment, it can be seen that when the length L1 of the third trench TR3 is small, stress generated in the vicinity of the substrate contact SC can be reduced. As a result, semiconductor device SD according to the present embodiment, even in a vicinity of the substrate contact SC, the first element isolation part EI1, the second element isolation part EI2, the semiconductor element SE, and the like can be formed. For example, when the first void VD1 is formed in the first element isolation part EI1, stress concentrate on the top portion of the first void VD1, and crack tends to occur in the first interlayer insulating layer IIL1. However, the semiconductor device SD according to the present embodiment, because the length L1 of the third trench TR3 is 30 μm or less, the first element isolation part EI1 can be formed in the vicinity of the substrate contact SC. For example, the first element isolation part EI1 may be formed at a distance within 1 μm or more and 2 μm or less from the third trench TR3 in the width direction of the third trench TR3.

(Effect)

In the semiconductor device SD according to present embodiment, the first length L1 of the third trench TR3 in the extending direction of the third trench TR3 is greater than a second length of the third trench TR3 in the width direction perpendicular to the extending direction, and equal to or less than 30 μm. When the length L1 of the third trench TR3 is 30 μm or less, stress caused by the third insulating film IF3 and the conductive film CF formed in the third trench TR3 are rapidly reduced. Therefore, the third void VD3 formed within the conductive film CF is easily formed in a closed state by the conductive film CF. As a result, in the CMP step for forming the conductive film CF, the cleaning liquid is less likely to enter the third void VD3 in the conductive film CF. The formation of a reaction product between the material of the conductive film CF and the cleaning liquid is suppressed. As a result, a short circuit between adjacent wiring is suppressed through the reaction product. For example, short circuit of the first wiring WR1 and the second wiring WR2 through the reaction product is suppressed. As described above, according to the present embodiment, it is possible to improve the reliability of the semiconductor device SD.

[Modification]

Figure 13:
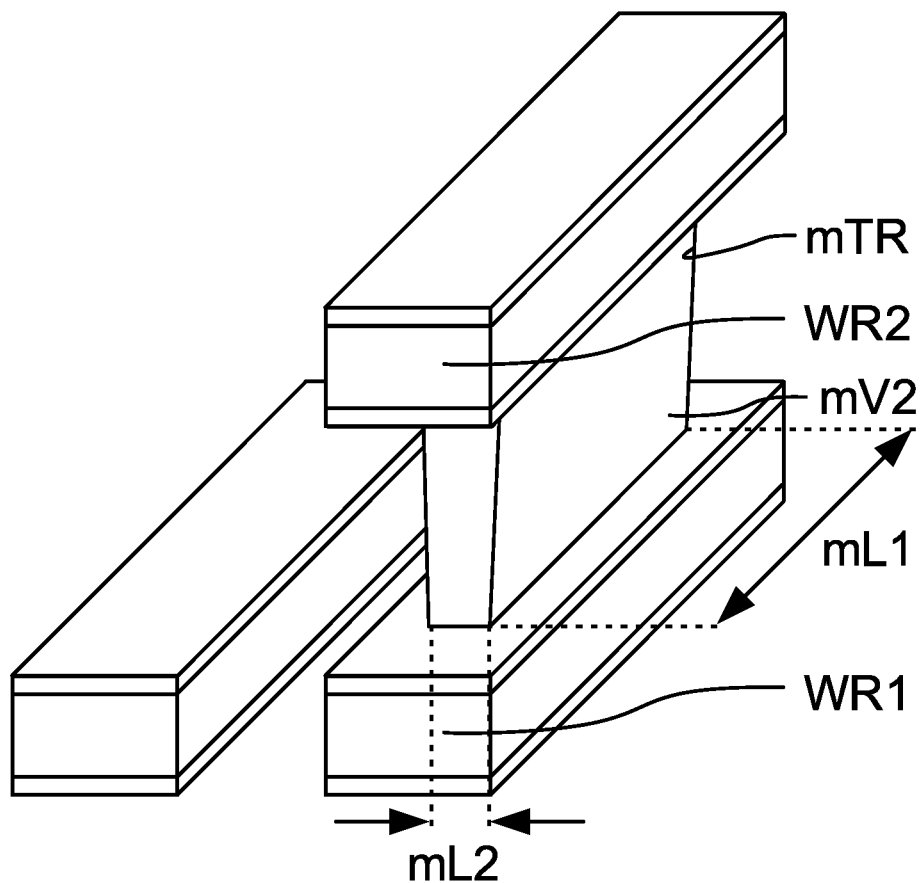
FIG. 13 is an enlarged perspective view showing an exemplary configuration of a main portion of a semiconductor device according to a modification.

FIG. 13 is an enlarged perspective view showing an exemplary configuration of a main portion of a semiconductor device according to a modification. More specifically, FIG. 13 is the enlarged perspective view showing the exemplary configuration of a via mV according to the modification. For example, FIG. 13 shows a region corresponding to a region surrounded by the broken line in FIG. 2. In FIG. 13, the second interlayer insulating layer IIL2 and the third interlayer insulating layer IIL3 are omitted from the viewpoint of clarity.

In the above embodiment, the stress of the substrate contact SC has been described, but the present invention is not limited to this embodiment. For example, as shown in FIG. 13, the semiconductor device according to the modification includes a second via mV2 formed in a trench mTR for a via formed in the multilayer wiring layer MWL. That is, the first length mL1 of the trench mTR for the via in an extending direction of the trench mTR for the via may be greater than a second length mL2 of the trench mTR for the via in a width direction perpendicular to the extending direction, and equal to or less than 30 μm. The second via mV2 is a so-called slit via. The first length mL1 of the trench mTR for the via in the extending direction is greater than the second length mL2 of the trench mTR for the via in the width direction. Because the trench mTR for the via is formed in the interlayer insulating layer, the insulating film on an inner side surface of the trench mTR for the via is not an essential element.

As is clear from the result of the simulation, regardless of the depth of the trench in which the conductive film is formed, as the length of the trench in the extending direction of the trench decreases, the stress caused by the conductive film decreases. For example, regardless of the depth of the trench in which the conductive film is formed, when the length of the trench is 30 μm or less, the stress caused by the conductive film rapidly decreases. Thus, it is obvious from the result of the simulation that the present invention can be applied not only to the substrate contact SC but also to the second via mV2 in the multilayer wiring layer MWL.

It should be noted that the present invention is not limited to the above-mentioned embodiment, and various modifications can be made without departing from the gist thereof. For example, the insulating film formed in the first trench TR1, the insulating film formed in the second trench TR2, and the insulating film formed in the third trench TR3 may be formed of the same material, or may be formed of different materials.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

Further, at least a portion of the embodiment and at least a portion of the modification may be arbitrarily combined with each other. The semiconductor device may include: a substrate contact SC formed in the third trench TR3; and the second via mV2 formed in the trench mTR for the via.

What is claimed is:

1. A semiconductor device comprising:
    a semiconductor substrate;
    a semiconductor layer formed on the semiconductor substrate, the semiconductor layer having a first trench and a second trench, the first trench and the second trench both extending in a depth direction so that the first trench and the second trench extend toward the semiconductor substrate;
    a first insulating film formed on an inner side surface of each of the first trench and the second trench such that a portion of the semiconductor substrate is exposed in each of the first trench and the second trench; and
    a conductive film electrically connected with the semiconductor substrate, and formed on the inner side surface of each of the first trench and the second trench through the first insulating film,
    wherein, in plan view, the first trench extends for a first length in an extending direction perpendicular to the depth direction,
    wherein, in plan view, the second trench extends for a third length in the extending direction perpendicular to the depth direction,
    wherein, in plan view, the first trench extends for a second length in a width direction perpendicular to both of the depth direction and the extending direction,
    wherein, in plan view, the second trench extends for a fourth length in the width direction perpendicular to both of the depth direction and the extending direction,
    wherein, in plan view, the first length of the first trench extending in the extending direction is greater than the second length of the first trench extending in the width direction,
    wherein, in plan view, the third length of the second trench extending in the extending direction is greater than the fourth length of the second trench extending in the width direction, wherein the first length of the first trench and the third length of the second trench are equal to or less than 30 µm, wherein the first trench and the second trench are arranged in the extending direction, wherein the semiconductor device further comprises a second insulating film formed in a third trench formed in the semiconductor layer such that the third trench extends in the depth direction and extends toward the semiconductor substrate, and wherein the first trench is surrounded by the third trench in plan view.

2. The semiconductor device according to claim 1, wherein, in plan view, the first length is greater than the second length, wherein, in plan view, the third length greater than the fourth length, and wherein the first length and the third length are equal to or less than 10 µm.

3. The semiconductor device according to claim 1, wherein the second insulating film is formed in the third trench such that a first void is formed within the second insulating film.

4. The semiconductor device according to claim 1, wherein the first trench and the second trench extend along the third trench in plan view.

5. The semiconductor device according to claim 4, wherein, in plan view, a distance between the first trench and the third trench and a distance between the second trench and the third trench are 1 µm or more, and 2 µm or less in the width direction.

6. The semiconductor device according to claim 1, wherein, in plan view, a distance between the first trench and the third trench and a distance between the second trench and the third trench are 1 µm or more, and 2 µm or less in the width direction.

7. The semiconductor device according to claim 1, comprising a third insulating film formed on the semiconductor layer, wherein the first trench and the second trench penetrate the third insulating film and the semiconductor layer such that the first trench and the second trench extend toward the semiconductor substrate.

8. The semiconductor device according to claim 1, comprising a third insulating film formed on the semiconductor layer, wherein the first trench, the second trench, and the third trench penetrate the third insulating film and the semiconductor layer such that the first trench, the second trench, and the third trench extend toward the semiconductor substrate.

9. The semiconductor device according to claim 7, comprising a wiring formed on the third insulating film, wherein the wiring is electrically connected with the semiconductor substrate through the conductive film.

10. The semiconductor device according to claim 3, wherein the conductive film is formed in each of the first trench and the second trench such that a second void is formed within the conductive film in each of the first trench and the second trench, and wherein a length of the second void is smaller than the length of the first void in a thickness direction of the semiconductor layer.

11. The semiconductor device according to claim 1, wherein a material of the conductive film comprises tungsten.

12. The semiconductor device according to claim 1, wherein the semiconductor substrate has a first conductivity type, and wherein the semiconductor layer comprises:

a first buried layer having a second conductivity type opposite to the first conductivity type; and a second epitaxial layer formed on the first buried layer.

13. A method of manufacturing a semiconductor device, comprising:

(a) providing a semiconductor wafer comprising:

a semiconductor substrate; and a semiconductor layer formed on the semiconductor substrate;

(b) forming a first trench and a second trench extending in a depth direction and penetrating the semiconductor layer so as to extend toward the semiconductor substrate;

(c) forming an insulating film on an inner side surface of each of the first trench and the second trench so that a portion of the semiconductor substrate is exposed in each of the first trench and the second trench; and (d) forming a conductive film on the insulating film formed on the inner side surface of each of the first trench and the second trench so as to be electrically connected to the semiconductor substrate, wherein, in plan view, the first trench extends for a first length in an extending direction perpendicular to the depth direction, wherein, in plan view, the second trench extends for a third length in the extending direction perpendicular to the depth direction, wherein, in plan view, the first trench extends for a second length in a width direction perpendicular to both of the depth direction and the extending direction, wherein, in plan view, the second trench extends for a fourth length in the width direction perpendicular to both of the depth direction and the extending direction, wherein, in plan view, the first length of the first trench extending in the extending direction is greater than the second length of the first trench extending in the width direction, wherein the first length of the first trench and the third length of the second trench are equal to or less than 30 µm, and wherein the first trench and the second trench are arranged in the extending direction, wherein the method further comprises (e) forming a third trench penetrating the semiconductor layer so as to extend toward the semiconductor substrate and (f) forming a second insulating film in the third trench, and wherein the first trench is surrounded by the third trench in plan view.

14. The method according to claim 13, wherein, in plan view, the first length is greater than the second length, wherein, in plan view, the third length is greater than the fourth length, and wherein the first length and the third length are equal to or less than 10 µm.

15. The method according to claim 13, wherein, in plan view, a distance between the first trench and the second trench and a distance between the second trench and the third trench are 1 µm or more, and 2 µm or less in the width direction.

* * * * *